United States Patent [19]

Sawagata

[11] 4,410,876
[45] Oct. 18, 1983

[54] D.C. STABILIZED ANALOG-TO-DIGITAL CONVERTER

[75] Inventor: Kiyoshi Sawagata, Isehara, Japan

[73] Assignee: Sony Corporation, Tokyo, Japan

[21] Appl. No.: 4,988

[22] Filed: Jan. 19, 1979

Related U.S. Application Data

[63] Continuation of Ser. No. 836,146, Sep. 23, 1977, abandoned.

[30] Foreign Application Priority Data

Sep. 27, 1976 [JP] Japan ................................ 51-115569

[51] Int. Cl.³ .......................................... H03K 13/02
[52] U.S. Cl. ...................... 340/347 CC; 340/347 AD
[58] Field of Search ................ 340/347 AD, 347 CC; 358/177, 178, 8

[56] References Cited

U.S. PATENT DOCUMENTS

| | | | |
|---|---|---|---|
| 3,365,713 | 1/1968 | Avignon | 340/347 AD |
| 3,560,648 | 2/1971 | Kitsopoulos | 358/178 |
| 3,789,389 | 1/1974 | Lenhoff | 340/347 AD |
| 3,816,825 | 6/1974 | Kaneko | 340/347 CC |
| 3,860,952 | 1/1975 | Tallent | 358/8 |

Primary Examiner—C. D. Miller

Attorney, Agent, or Firm—Lewis H. Eslinger; Alvin Sinderbrand

[57] ABSTRACT

A D.C. stabilized analog-to-digital converter of the type having a coarse converter responsive to a supplied analog signal for converting the analog signal to a coarse digital signal representation thereof, a reconverter for reconverting the coarse digital signal representation to a coarse analog signal and for determining the difference between the coarse analog signal and the supplied analog signal, and a fine converter responsive to the determined difference for converting said difference to a fine digital representation of the supplied analog signal. A reference signal is periodically supplied to the coarse converter such that this supplied reference signal is converted to a coarse digital signal representation thereof, the coarse digital signal representation of the reference signal is reconverted to a coarse analog reference signal and the difference between this coarse analog reference signal and the periodically supplied reference signal is determined. A detector is operative during the period that the reference signal is supplied to the coarse converter for detecting a D.C. drift in the operation of the reconverter. A uniform D.C. compensating signal is produced in accordance with the detected D.C. drift and is applied to the reconverter so as to compensate for such D.C. drift.

14 Claims, 6 Drawing Figures

D.C. STABILIZED ANALOG-TO-DIGITAL CONVERTER

This is a continuation of application Ser. No. 836,146, filed Sept. 23, 1977 now abandoned.

BACKGROUND OF THE INVENTION

This invention relates to analog-to-digital converters and, more particularly, to a D.C. stabilized analog-to-digital converter wherein D.C. drift in the converter is detected and compensated so as to minimize errors in the produced digital signal.

Analog-to-digital converters are widely used in divers applications in order to exploit the accuracy and speed of digital processing techniques upon information which may originate in the form of analog signals. As one example thereof, video signals, such as color television signals, which originate as analog signals, may be digitized for the purpose of exploiting certain advantageous processing techniques. One such processing technique is used to correct time-base errors which may be present in the video signal. Such time-base errors may occur when a video signal is recorded and subsequently reproduced because of small changes or fluctuations in the reproducing apparatus relative to the recording apparatus. Thus, if video signals are recorded and then reproduced by a video tape recorder (VTR), time-base errors may result if the speed at which the magnetic tape is transported during a reproducing operation differs from that during a recording operation, or if the rotary speed of the transducers during a reproducing operation differs from the rotary speed thereof during a recording operation, or if the tape is subjected to shrinkage, stretching, and the like after the video signals have been recorded but before such video signals are reproduced.

One example of time-base error correcting apparatus which can be used to correct the aforementioned time-base errors is described in U.S. Pat. No. 3,860,952. In that apparatus, the analog video signal, after being reproduced from a VTR, is converted to a digital signal and then written into a memory device at a rate synchronized with the time-base error rate, these stored digital video signals then being read out of the memory device at a uniform clocking rate. This results in minimizing time-base errors in the digital video signal that eventually is read out of the memory; and the corrected video signal then can be reconverted back to its analog form for transmission to video signal receiving and displaying apparatus. The analog-to-digital converter described in the aforementioned patent is of the so-called parallel-serial converter wherein the incoming analog signal is sampled and each sampled portion is converted to a digital carrier in two separate parallel-bit conversions which occur serially. In the first conversion, the analog signal is supplied to a first set of coarse comparators wherein the sampled level is compared to predetermined voltage levels, the coarse comparators thus providing a first coarse conversion of the sample. This coarse conversion is encoded to a coarse digital signal, and the complementary outputs of the comparators are reconverted to an inverse coarse analog signal which is summed with the original sample. The summed output, which is proportional to the difference between the original analog sample and the coarse analog sample, is supplied to a set of fine comparators whereat a fine digital signal is produced. The combination of the coarse and fine digital signals is a digital representation of the original analog sample.

An improved version of such a parallel-serial analog-to-digital converter is disclosed in copending Application Ser. No. 681,507, filed Apr. 29, 1976 and assigned to the assignee of the present invention. In the improved parallel-serial analog-to-digital converter, the reference voltages which are applied to the set of fine comparators have a range which is greater than and offset in respect to the reference voltage steps which are applied to the coarse comparator. Also, the least significant bit of the coarse analog-to-digital converter is added to the output of the fine analog-to-digital converter. Hence, in the improved version, inaccuracies in the digital signal which may arise from non-uniform reference voltages and/or operations of the comparators are minimized.

One problem of parallel-serial analog-to-digital converters of the foregoing type is that D.C. drift in particular circuit components may result in significant errors in the resultant digital signal. For example, if the digital-to-analog converter and/or the subtracting (or inverse summing) circuit is subjected to D.C. drift, the signal which is supplied to the fine analog-to-digital converter may be more (or less) than the actual difference between the original analog signal and the coarse analog signal. If there are a number of coarse converter stages and fine converter stages, the effect of such D.C. drift is cumulative, resulting in substantial errors in the digitized analog signal. If the analog signal is a video signal, as has been assumed above, the ultimate video picture reproduced from that video signal, following its digitization and then analog reconversion, will be substantially degraded. Accordingly, there is a need to detect D.C. drift in the circuit components and to correct or compensate such D.C. drift.

A video signal includes periodic horizontal blanking intervals during which a horizontal synchronizing pulse is transmitted and a burst signal (the chrominance subcarrier reference signal) also is transmitted. According to various standards which have been adopted, such as the NTSC format, the minimum level of the synchronizing pulse, known as the sync tip level, and the quiescent level of the horizontal blanking interval, known as the pedestal level, are assigned certain predetermined, reference levels. The video information signal then can be referenced to the sync tip or pedestal levels, and these levels can be detected and used to control the gain of video amplifiers, as well as other video processing circuits. It was thought that the sync tip and/or pedestal levels also could be used to control or compensate for D.C. drift in the analog-to-digital converter components. However, the D.C. level of the video signal, including the sync tip and pedestal levels, may vary from their desired, predetermined levels when, for example, the video signal is reproduced from a record medium. Even though D.C. restore circuits are well known and commmonly used to restore the D.C. level of the reproduced video signal, the sync tip and/or pedestal levels of the restored video signal still may differ from their desired levels because of noise, D.C. drift, and other factors. Thus, it is believed that the sync tip level or the pedestal level of a video signal cannot be used as a reference against which D.C. drift is detected.

OBJECTS OF THE INVENTION

Therefore, it is an object of the present invention to provide an improved D.C. stabilized analog-to-digital converter.

Another object of this invention is to provide apparatus for detecting and reducing D.C. drift which may be present in an analog-to-digital converter.

A further object of this invention is to provide an improved parallel-serial analog-to-digital converter for digitizing a video signal and wherein D.C. drift of various components of the converter is dynamically compensated.

An additional object of this invention is to provide a D.C. stabilized analog-to-digital converter for use with a video signal wherein a portion of the video signal periodically is replaced with an absolute reference level which reference level, after processing by the converter, is used to detect and compensate for D.C. drift.

Various other objects, advantages and features of this invention will become readily apparent from the ensuing detailed description, and the novel features will be particularly pointed out in the appended claims.

SUMMARY OF THE INVENTION

In accordance with the present invention, a D.C. stabilized analog-to-digital converter is comprised of a coarse converter responsive to a supplied analog signal for converting the analog signal to a coarse digital signal representation thereof; a reconverter for reconverting the coarse digital signal representation to a coarse analog signal and for determining the difference between the coarse analog signal and the supplied analog signal; and a fine converter responsive to the determined difference for converting said difference to a fine digital representation of the supplied analog signal, the combination of the coarse and fine digital representations constituting the converted digital signal. A reference signal is periodically supplied to the coarse converter such that this periodically supplied reference signal is converted to a coarse digital signal representation and then reconverted to a coarse analog reference signal, the difference between this coarse analog reference signal and the periodically supplied reference signal being determined. A detector is operative during the period that the reference signal is supplied to the coarse converter for detecting a D.C. drift in the operation of the reconverter. The detected D.C. drift is used to apply a uniform D.C. compensating signal to the reconverter. In one embodiment, the detector comprises a comparator for comparing the difference the coarse analog reference signal and the periodically supplied reference signal to a predetermined reference level, this comparison serving to produce the D.C. compensating signal.

BRIEF DESCRIPTION OF THE DRAWINGS

The following detailed description, given by way of example, will best be understood in conjunction with the accompanying drawings in which.

DETAILED DESCRIPTION OF CERTAIN PREFERRED EMBODIMENTS

Figure 1:
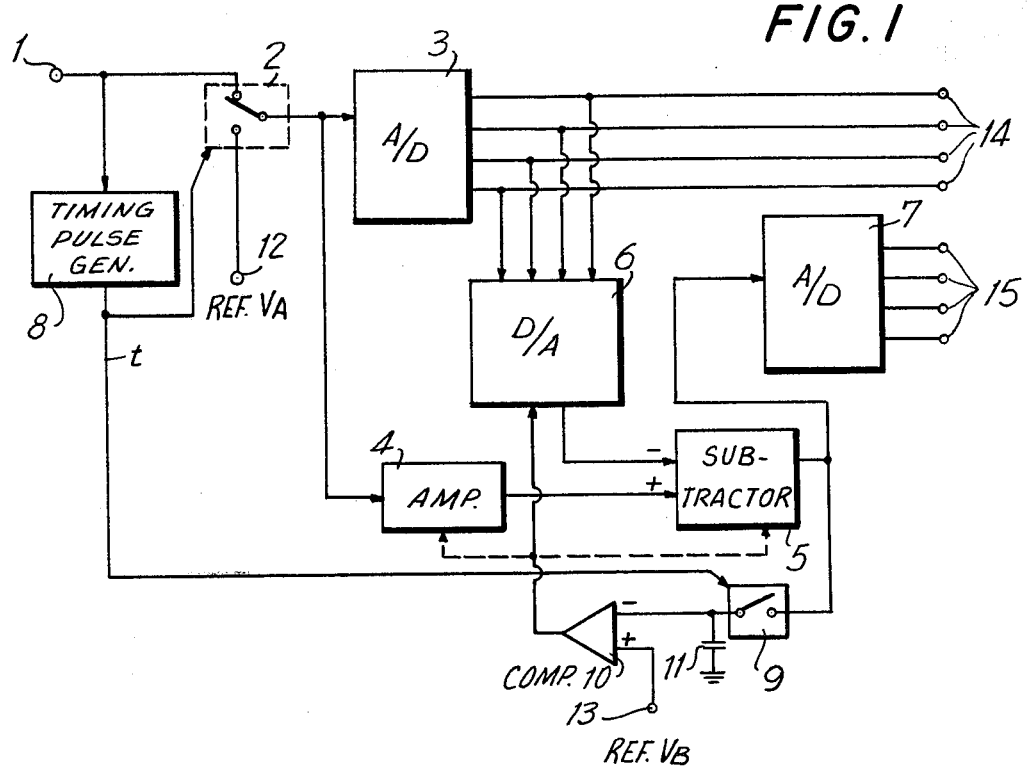
FIG. 1 is a block diagram showing a basic analog-to-digital converter employing the D.C. stabilizing technique of the present invention.

Referring now to the drawings, and in particular to FIG. 1, there is illustrated a block diagram of a simplified analog-to-digital converter wherein the D.C. stabilizing techniques of the present invention are incorporated. For the purpose of this description, it will be assumed that the analog signal which is converted by the illustrated apparatus is a video signal. This is particularly suited for digital time-base error correcting techniques. However, and as should be clearly understood, the present invention is applicable to analog-to-digital converters which may operate upon any type of analog signal and need not be limited solely to analog video signals. As illustrated, the apparatus includes an input terminal 1 adapted to receive the analog signal, a coarse analog-to-digital (A/D) converter 3, a digital-to-analog (D/A) converter 6, a subtracting circuit 5 and a fine A/D converter 7. D.C. stabilizing circuitry is comprised of a timing pulse generator 8, a sample-and-hold circuit 9, 11 and a comparator 10. Input terminal 1 is coupled by a switching circuit 2 to coarse A/D converter 3. The coarse converter is adapted to convert the analog signal supplied thereto to a coarse digital representation thereof formed of, for example, m bits. m output terminals 14 are coupled to coarse A/D converter 3.

D/A converter 6 includes m inputs coupled to the m output terminals 14, respectively, and is adapted to produce a coarse analog version of the coarse digital signal supplied thereto. Accordingly, the D/A converter may be any typical digital-to-analog converter, such as a resistive ladder network, or the like. The output of D/A converter 6 is coupled to one input of subtracting circuit 5 for the purpose of being subtracted from the originally supplied analog signal. Accordingly, subtracting circuit 5 includes another input coupled to input terminal 1 optionally via an amplifier 4. The output of subtracting circuit 5, which is proportional to the difference between the analog signal supplied to coarse A/D converter 3 and the coarse analog signal produced by D/A converter 6, is coupled to fine A/D converter 7. The coarse and fine A/D converters may be of the type described in the aforementioned patent or copending application, or may comprise other conventional analog-to-digital converters. Fine A/D converter 7 is adapted to produce a fine n bit digital signal corresponding to the analog signal supplied thereto by subtracting circuit 5. This fine n bit digital signal is applied to n output terminals 15, respectively. It may be appreciated that the (m+n) bits provided at output terminals 14 and 15 constitute a k-bit digital signal which is an accurate representation of the analog signal applied to input terminal 1. For the purpose of simplifying the present discussion, let it be assumed that $m=n=4$. Hence, of the 8-bit digital signal produced at output terminals 14 and 15, the four most significant (MSB) bits are produced by coarse A/D converter 3 and the four least significant bits (LSB) are produced by fine A/D converter 7.

If the D.C. level at which D/A converter 6 or subtracting circuit 5 or amplifier 4 operates drifts from the predetermined operating level, it is appreciated that the coarse analog signal produced by D/A converter 6 or the difference signal produced by subtracting circuit 5 or the amplified analog signal provided by amplifier 4 will include an erroneous component. Consequently, the analog signal supplied to fine A/D converter 7 will include this erroneous component and, hence, will not be a true representation of the difference between the actual analog signal applied to coarse A/D converter 3 and the actual coarse analog signal which is reconverted by D/A converter 6. Consequently, the least significant bits provided at output terminals 15 may be in error.

The foregoing is compensated by periodically supplying a reference level $V_A$ to coarse A/D converter 3, and by detecting the D.C. drift of any one or all of amplifier 4, subtracting circuit 5 and D/A converter 6 relative to this periodically supplied reference level. The detected D.C. drift then is used to produce a compensating D.C. signal which, in turn, is supplied to one or more of amplifier 4, subtracting circuit 5 and D/A converter 6 for the purpose of restoring the D.C. level thereof to its predetermined operating level. To this effect, switching circuit 2 includes another input 12 to which reference level $V_A$ is applied, and this switching circuit also includes a timing input coupled to timing pulse generator and responsive to periodic timing pulses produced by the timing pulse generator to switch the output thereof from input terminal 1 to input terminal 12 for the duration of each timing pulse. Also, the output of subtracting circuit 5 additionally is coupled to the sample-and-hold circuit formed of sampling circuit 9, which may comprise a switching circuit, and a hold capacitor 11. As shown, switching circuit 9 includes a sampling pulse input coupled to timing pulse generator 8 and is responsive to the periodically produced timing pulses for sampling the signal produced by subtracting circuit 5. Each sample produced by this sampling circuit 9 is stored in capacitor 11 until the next sample is obtained.

Comparator 10, which may comprise a difference amplifier, includes a reference input 13 adapted to receive a predetermined reference level $V_B$ and another input coupled to capacitor 11. Reference level $V_B$ optionally may be equal to reference level $V_A$, and these reference levels may be produced either by separate reference level sources, by voltage divider networks, or by other suitable means. As may be appreciated, comparator 10 is operative to subtract the sampled signal stored in capacitor 11 from reference level $V_B$, and the difference between the signals is applied to one or more of amplifier 4, subtracting circuit 5 and D/A converter 6. Preferably, the output of comparator 10, which serves as a D.C. compensating signal, is applied to D/A converter 6 so as to adjust the D.C. operating level thereof accordingly. The broken lines illustrated in FIG. 1 represent that this D.C. compensating signal alternatively may be applied to either or both of amplifier 4 and subtracting circuit 5 so as to correspondingly adjust the D.C. operating levels of these circuits.

Timing pulse generator 8 is adapted to produce periodic timing pulses of predetermined duration for application to switching circuits 2 and 9. If the analog signal applied to input terminal 1 is a video signal, timining pulse generator 8 may include a conventional horizontal synchronizing separator circuit for separating the periodic horizontal synchronizing signals from the video signal, and a pulse generator, such as a monostable multivibrator, responsive to the separated horizontal synchronizing signals for generating the periodic timing pulses.

Figure 2A:
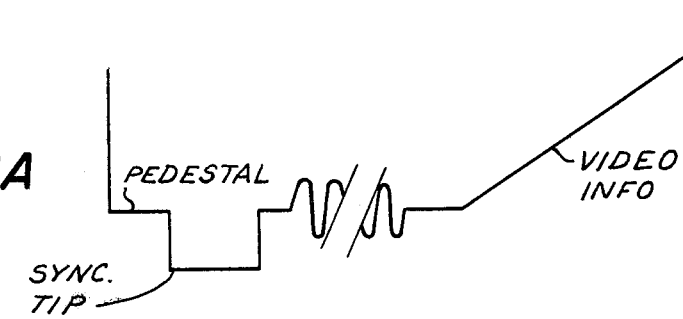
FIGS. 2A–2D are waveform diagrams which are useful in understanding the operation of the apparatus depicted in FIG. 1.
Figure 2B:
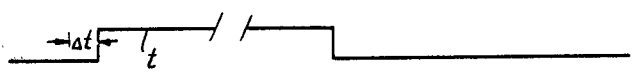
Figure 2C:
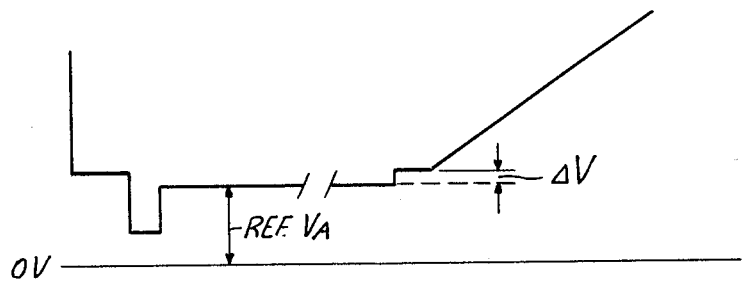

The operation of the apparatus illustrated in FIG. 1 now will be described with reference to the waveform diagrams shown in FIGS. 2A-2D. Let it be assumed that the analog signal applied to input terminal 1 is a composite color television signal formed of periodic horizontal blanking intervals having a pedestal level, a sync tip level and a predetermined number of cycles of the burst signal, as shown in FIG. 2A. Timing pulse generator 8 is responsive to the horizontal synchronizing signals to produce periodic timing pulses t (FIG. 2B) which are timed to occur during the horizontal blanking interval and at a predetermined time $\Delta t$ following the commencement of the synchronizing pulse. Timing pulses t are applied to switching circuit 2 to change over the output thereof from input terminal 1 to input terminal 12. Thus, during the duration of timing pulse t, the horizontal blanking interval is replaced by the reference voltage level $V_A$, as shown in FIG. 2C. As also represented in FIG. 2C, in the event that the sync tip and pedestal levels deviate from their respective predetermined levels because of noise or other factors, the reference level $V_A$, which may be equal to the predetermined pedestal level, differs from the actual pedestal level by an amount $\Delta V$.

Coarse A/D converter 3 converts reference level $V_A$ to a coarse digital representation thereof, and D/A converter 6 reconverts this coarse digital signal to a corresponding coarse analog signal having a level $v_1$. This coarse analog reference signal is subtracted from the amplified reference level $AV_A$ by subtracting circuit 5 to produce a difference signal equal to $AV_A-V_1$. Timing pulse t, which had actuated switching circuit 2 to change over from input terminal 1 to input terminal 12, also actuates switching circuit 9 to sample this difference signal $AV_A-V_1$. This sampled difference signal is subtracted from reference level $V_B$, and the resultant output of comparator 10 has a magnitude proportional to $V_B-(AV_A-V_1)$. This output of comparator 10 is applied as a DC compensating signal to D/A converter 6. Alternatively, or in addition thereto, this D.C. compensating signal may be applied to either or both of amplifier 4 and subtracting circuit 5. If it is assumed that reference level $V_B$ is equal to reference level $V_A$, the D.C. compensating signal produced by comparator 10 is proportional to $V_A(1-A)+V_1$. It is seen that this D.C. compensating signal also is indicative of D.C. drift in any or all of D/A converter 6, subtracting circuit 5 and amplifier 4. In one embodiment, if no D.C. drift is detected, that is, if the amplifier, subtracting circuit and/or D/A converter operate at their desired operating points, the D.C. compensating signal produced by comparator 10 is equal to zero. In that event, the gain of amplifier 4 may be selected as 2, and the output of D/A converter 6 in response to the coarse digital representation of reference $V_A$ is equal to $V_A$. However, and as is appreciated, the gain of amplifier 4 and the coarse digital representation of reference level $V_A$ may be any desired values within the aforementioned relation. In any event, any D.C. drift in the analog-to-digital converting components is detected by comparator 10, and this detected D.C. drift is fed back to the analog-to-digital converting components so as to adjust the D.C. operating levels of certain ones of such components, thereby compensating for the detected D.C. drift.

Figure 2D:
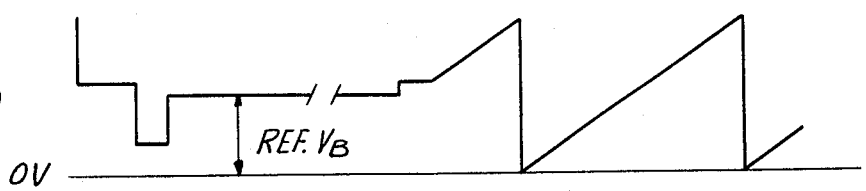

The output of subtracting circuit 5 is illustrated in FIG. 2D. At the start of the horizontal blanking interval, the amplified pedestal level supplied to subtracting circuit 5 by amplifier 4 differs from the coarse analog pedestal level such that subtracting circuit 5 produces the illustrated output level. Similarly, the amplified sync tip differs from the coarse analog sync tip such that subtracting circuit 5 produces a sync tip level that differs from zero. When that portion of the horizontal blanking interval is replaced by reference level $V_A$, the coarse analog reference level differs from the amplified reference level by an amount such that subtracting circuit 5 produces an output level $V_B$. It had been assumed above in one embodiment thereof that reference level $V_B$ is equal to reference level $V_A$. Hence, the output $V_B$ of subtracting circuit 5 (FIG. 2D) is equal to reference level $V_A$.

During the information portion of the video signal, the analog signal applied to input terminal 1 will reach a magnitude having a corresponding fine digital representation equal to (0000). That is, the digital representation of this level will be wholly represented by the most significant bits produced by coarse A/D converter 3. At that time, the reconversion of these most significant bits by D/A converter 6 will produce a coarse analog signal which is equal to the amplified analog signal supplied to subtracting circuit 5 by amplifier 4. Hence, the output of the subtracting circuit at this time will be substantially equal to zero, as shown in FIG. 2D. For the assumed example wherein the most significant bits are constituted by m=4, there are fifteen different levels whereat the analog signal applied to input terminal 1 is wholly represented only by the most significant bits. That is, there are fifteen different analog signal levels wherein all of the least significant bits are equal to zero.

Although FIG. 2D represents that the output of subtracting circuit 5 is reduced to a zero level when the analog input signal reaches a level that is wholly represented by most significant bits, it may be appreciated that the output of the subtracting circuit may fall to a level determined by the gain of amplifier 4. If this gain is unity, the output of the subtracting circuit will fall to the zero level.

Since the output of subtracting circuit 5 is sampled by switching circuit 9 and stored by capacitor 11 during the time that reference level $V_A$ is inserted into the analog signal, it is appreciated that the DC compensating signal produced by comparator 10 will be substantially uniform for the interval between successive samples. The uniformity of this D.C. compensating signal is determined by the leakage time constant of capacitor 11. Thus, even when switching circuit 9 is deactuated, and when the analog signal supplied to input terminal 1 is coupled through switching circuit 2 to the analog-to-digital converting apparatus, the D.C. compensating signal produced by comparator 10 will be substantially maintained and applied to one or more, or even all, of D/A converter 6, subtracting circuit 5 and amplifier 4. Hence, the D.C. operating level of these respective circuits is maintained at its desired level throughout the interval separating successive samples, that is, throughout the video information interval.

In view of the change $\Delta V$ in the pedestal level of the input video signal, as shown in FIG. 2C, because of noise or other factors, it is preferred not to rely upon this pedestal level as the periodically supplied reference level for the purpose of detecting D.C. drift. Because of this pedestal level error $\Delta V$, the insertion of reference level $V_A$ during a horizontal blanking interval provides an accurate, absolute reference level against which the D.C. drift can be measured.

While the foregoing has assumed that reference level $V_A$ is inserted into the video signal during each horizontal blanking interval, this insertion may be carried out during every other, every third or every b-th interval, where b equals 1, 2, 3, . . . .

Figure 3:
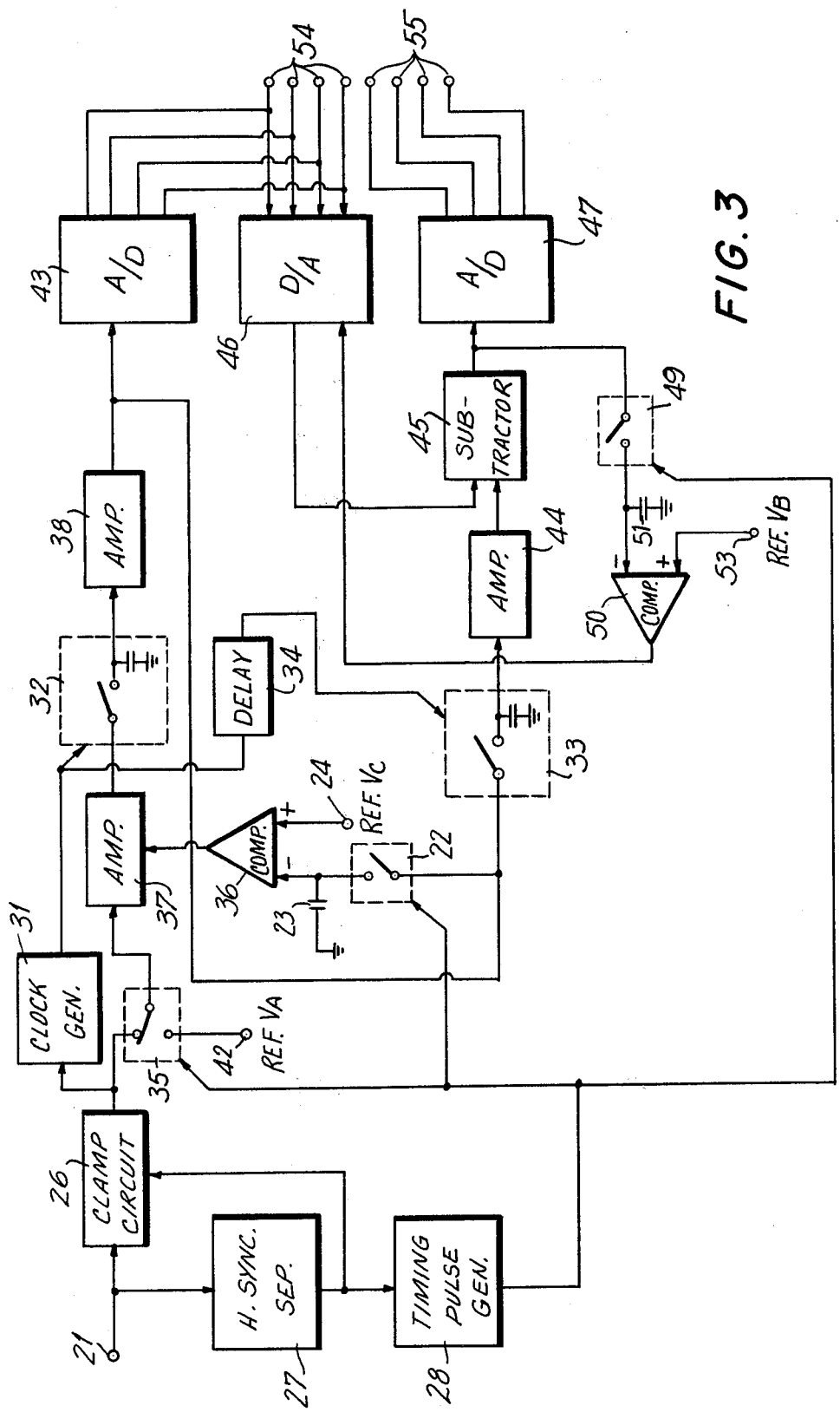
FIG. 3 is a block diagram of one embodiment of a practical analog-to-digital converter employing the D.C. stabilizing techniques of the present invention.

A practical embodiment of a D.C. stabilized analog-to-digital converter is shown in FIG. 3. A comparison of this figure with aforedescribed FIG. 1 indicates the use of many of the same devices in both figures. Hence, in FIG. 3, an input terminal 21 is provided to receive the analog signal which is to be digitized, such as a video signal, this input terminal being coupled to a switching circuit 35 which is similar to switching circuit 2. The output of switching circuit 35 is coupled to coarse A/D converter 43, which is similar to coarse A/D converter 3, and also via amplifier 44 to a subtracting circuit 45. Amplifier 44 and subtracting circuit 45 are similar to amplifier 4 and subtracting circuit 5. The outputs of A/D converter 43 are coupled to D/A converter 46 which, in turn, is coupled to another input of subtracting circuit 45. D/A converter 46 is similar to previously described D/A converter 6. The output of subtracting circuit 45 is coupled to fine A/D converter 47, which is similar to fine A/D converter 7, and the outputs of coarse A/D converter 43 and fine A/D converter 47 are coupled to outputs 54 and 55, respectively.

For detecting D.C. level drift and for applying a D.C. compensating signal to the digital-to-analog converting apparatus, a sample-and-hold circuit formed of switching circuit 49 and hold capacitor 51 is coupled to the output of subtracting circuit 45, similar to switching circuit 9 and hold capacitor 11. A comparator 50 is coupled to receive a reference level $V_B$ applied to input terminal 53 and to subtract from this reference level the output of subtracting circuit 45 which is sampled by switching circuit 49 and stored by capacitor 51. Comparator 50 is similar to aforedescribed comparator 10 and supplies a D.C. compensating signal to, for example, D/A converter 46.

The embodiment shown in FIG. 3 illustrates that horizontal synchronizing separator circuit 27 and timing pulse generator 28 may be provided as separate circuits. It is recalled that in describing the apparatus in FIG. 1, it was assumed that timing pulse generator 8 includes a horizontal synchronizing separator circuit.

A clamp circuit 26 couples input terminal 21 to switching circuit 35 and is controlled by the output of horizontal synchronizing separator 27. In particular, the horizontal synchronizing separator may provide a pedestal level, derived from the horizontal blanking interval of the video signal applied to input terminal 21, to clamp circuit 26 so as to clamp the video signal to the derived pedestal level. Nevertheless, it is appreciated that the derived pedestal level may differ from the true pedestal level by an amount $\Delta V$, such as described previously with respect to FIG. 2C. A clock generator 31 is coupled to clamp circuit 26 and is adapted to produce clock signals of a relatively high frequency. As one example thereof, the clock generator may produce clock signals of a frequency equal to 10.7 MHz, these clock signals being synchronized to the horizontal synchronizing signal of the video signal applied to input terminal 21 via the horizontal synchronizing separator and clamp circuit. As one example, clock generator 31 may be supplied with separated horizontal synchronizing pulses and may include a frequency multiplier so as to multiply the frequency of the horizontal synchronizing pulses by a factor to produce clock pulses of the 10.7 MHz frequency or, alternatively, clock generator 31 may include a controllable oscillator for producing the 10.7 MHz clock pulses, which oscillator is synchronized with the separated horizontal synchronizing pulses.

Switching circuit 35 is coupled to coarse A/D converter 43 via an amplifier 37, sampling circuit 32 and amplifier 38. Either or both of amplifiers 37 and 38 may function as buffer amplifiers, and sampling circuit 32 is adapted to sample the analog signal at the 10.7 MHz clock rate determined by clock generator 31. Thus, if a video signal is applied to input terminal 21, sampling circuit 32 samples this video signal at a rate which is approximately equal to three times the color subcarrier frequency. Each sample produced by sampling circuit 32 and amplified by amplifier 38 is converted to a coarse digital representation by coarse A/D converter 43.

The analog signal, and more particularly, the sampled analog signal, which is applied to coarse A/D converter 43 also is applied to subtracting circuit 45 via another sampling circuit 33 and an amplifier 44, as shown. Thus, subtracting circuit 45 is adapted to produce a difference signal proportional to the difference between the sampled analog signal and the coarse analog signal, similar to the operation of subtracting circuit 5 described previously with respect to FIG. 1. The sampling pulses applied to sampling circuit 33 from clock generator 31 are delayed by a predetermined amount in delay circuit 34, this delay serving to allow for the time delays of coarse A/D converter 43 and D/A converter 46. Thus, subtracting circuit 45 receives the sample of the analog signal which had been applied to coarse A/D converter 43 at the same time that D/A converter 46 produces the coarse analog signal corresponding to that sample.

The embodiment of FIG. 3 also includes circuitry for detecting D.C. drift in amplifier 37, amplifier 38 or sampling circuit 32. An additional comparator 36, similar to comparators 10 or 50, includes an input coupled to terminal 24 to which a reference level $V_C$ is applied, together with another input coupled via a sample-and-hold circuit formed of switching circuit 22 and hold capacitor 23 to the output of amplifier 38. Switching circuit 22 is supplied with sampling pulses from timing pulse generator 28, and thus is operated in synchronism with switching circuits 35 and 49.

The operation of the embodiment shown in FIG. 3 is substantially similar to the operation described hereinabove in conjunction with FIG. 1. Thus, D.C. drift in D/A converter 46 is detected by comparing the output of subtracting circuit 45 with reference level $V_B$ during the time that reference level $V_A$ is substituted for a portion of the horizontal blanking interval included in the video signal applied to input terminal 21. The detected D.C. drift results in a D.C. compensating signal which is applied to D/A converter 46 by comparator 50 for the purpose of minimizing such D.C. drift.

At the same time that switching circuit 49 is actuated in order to detect D.C. drift of D/A converter 46, switching circuit 22 is actuated in order to detect D.C. drift in amplifiers 37 or 38 or in sampling circuit 32. That is, the amplified and sampled reference level $V_A$, which is supplied from terminal 42 through actuated switching circuit 35, amplifier 37, sampling circuit 32 and amplifier 38 is sampled by switching circuit 22 and stored on capacitor 23. This amplified reference level $V_A$ is compared by comparator 36 to reference level $V_C$. If it is assumed that the amplified reference level $V_A$ differs from reference level $V_C$ by a predetermined amount in the event that there is no D.C. drift in amplifiers 37 or 38 or in sampling circuit 32, then any change from this predetermined amount is detected by comparator 36 and supplied to, for example, amplifier 37 as a D.C. compensating signal therefor. That is, if there is D.C. drift in any one or all of amplifiers 37 or 38 or in sampling circuit 32, the amplified reference level $V_A$, suppled to comparator 36, will differ from reference level $V_C$ by more (or less) than the aforementioned predetermined amount. This difference adjusts the D.C. compensating signal to correspondingly change the D.C. operating level of amplifier 37 or of amplifier 38 or of sampling circuit 32.

From FIG. 3, it is seen that the output of amplifier 38 is sampled by sampling circuit 33, is further amplified by amplifier 44 and is supplied to subtracting circuit 45. Hence, if there is any D.C. drift in amplifiers 37 or 38 or in sampling circuit 32, this D.C. drift will affect the output of subtracting circuit 45, whereby an erroneous digital representation thereof will be produced by fine A/D converter 47. Since comparator 50 cannot compensate for this D.C. drift, it is appreciated that the omission of comparator 36 may result in an erroneous operation of subtracting circuit 45 and fine A/D converter 47. For this reason, the use of comparator 36 is preferred.

Thus, by providing D.C. compensating signals in the manner shown in FIGS. 1 and 3, the operation of the parallel-serial analog-to-digital converting apparatus is balanced. That is, D.C. drift will not introduce errors into the fine digitizing of the analog signal. Also, by periodically inserting a reference level $V_A$ into the analog signal, any D.C. errors in reference portions of the original analog signal, such as the sync tip or pedestal levels of a video signal, do not affect the detection and compensation of D.C. drift. Also, by inserting reference level $V_A$ periodically into the analog signal, there is no D.C. error, caused by drift, noise or other factors, between this inserted reference level and reference levels $V_B$ and $V_C$. Consequently, the operation of comparators 10 (FIG. 1) and 36 and 50 (FIG. 3) is not affected by D.C. errors. This is because the D.C. level of any self-contained reference signal, such as the D.C. level of the sync tip level or the pedestal level of a video signal, may vary relative to reference levels $V_B$ and $V_C$, but inserted reference level $V_A$ will not vary relative to reference levels $V_B$ and $V_C$.

While the present invention has been particularly shown and described with reference to preferred embodiments thereof, it should be readily apparent to one of ordinary skill in the art that various changes and modifications may be made in form and details without departing from the spirit and scope of the invention. For example, although a single coarse A/D converter and a single fine A/D converter are shown, a plurality of coarse and fine A/D converters can be used, if desired. In that event, the coarse digital signal produced by one coarse A/D converter will be reconverted to a coarse analog signal and subtracted from the original analog signal, the difference therebetween being supplied to the next coarse A/D converter. Then, the output of this next coarse A/D converter is reconverted back to a coarse analog signal which, in turn, is subtracted from the output of the previous subtractor, any difference therebetween being supplied to the next A/D converter, and so on. When additional A/D converters are used, one or more comparators, similar to comparators 10 or 50, may be used to adjust the D.C. operating levels of the respective D/A converters or subtractors in accordance with detected D.C. drift by applying D.C. compensating signals thereto. As another example, clock generator 31 may be synchronized with the frequency of the burst signal included in the composite video signal which may be applied to input terminal 21. Accordingly, a burst signal detector may be provided for separating the burst signal from the video signal and for applying same as a synchronizing signal to the clock generator.

It is intended that the appended claims be interpreted as including the foregoing changes as well as those changes mentioned and implied in the previous discussion of the present invention, together with other similar changes as will become apparent to those of ordinary skill in the art.

What is claimed is:

1. A D.C. stabilized analog-to-digital converter of the parallel-serial type, comprising:
   means for supplying an analog signal consisting of a video signal which includes video portions and horizontal blanking intervals and which is to be converted to a corresponding digital signal;
   coarse parallel converting means responsive to the supplied analog signal for converting said analog signal to a coarse digital representation thereof;
   re-converting means for re-converting said coarse digital signal representation to a coarse analog signal;
   means for determining the difference between said coarse analog signal and said supplied analog signal;
   fine parallel converting means responsive to the determined difference for converting said difference to a fine digital representation of said supplied analog signal;
   means operative periodically during horizontal blanking intervals for supplying a reference signal to said coarse converting means in which said reference signal is converted to a coarse digital signal representation thereof, and said re-converting means reconverts said coarse digital signal representation of said reference signal to a coarse analog reference signal with said difference then being the difference between said coarse analog reference signal and said reference signal;
   means for storing said difference produced in response to said reference signal at least during a succeeding one of said video portions;
   comparator means for comparing the stored difference with a fixed reference level to produce a fixed D.C. compensating signal as a function of the comparison;
   and means for employing said D.C. compensating signal in said re-converting means during each said video portion to compensate for D.C. drift.

2. The converter of claim 1 wherein said re-converting means comprises a digital-to-analog converter connected to receive said coarse digital signal representation and for producing said coarse analog signal in response thereto, subtractor means for receiving said coarse analog signal and for subtracting same from said supplied analog signal, and an amplifier for amplifying said supplied analog signal and for applying same to said subtractor means.

3. The converter of claim 2 wherein said means for applying said D.C. compensating signal to said re-converting means comprises means for applying same to said digital-to-analog converter to correspondingly change the D.C. level of said coarse analog signal.

4. The converter of claim 2 wherein said means for applying said D.C. compensating signal to said re-converting means comprises means for applying same to said subtractor means to correspondingly change the D.C. level of the output therefrom.

5. The converter of claim 2 wherein said means for applying said D.C. compensating signal to said re-converting means comprises means for applying same to said amplifier to correspondingly change the D.C. level of the amplified analog signal.

6. The converter of claim 1 wherein said reference signal and said fixed reference level are equal D.C. levels.

7. The converter of claim 1 wherein said comparator means comprises a difference amplifier having one input connected to receive said reference level and another input connected to receive said difference between said coarse analog reference signal and said reference signal; and sample-and-hold means for periodically sampling said difference and applying same to said another input until the next sample is obtained.

8. The converter of claim 7 wherein said means for periodically supplying a reference signal to said coarse converting means comprises switch means having one input connected to receive said supplied analog signal, another input connected to receive said reference signal and an output connected to said coarse converting means; and a source of periodic switching signals coupled to said switch means for selectively switching the output of said switch means between the inputs thereof, said switching signals being further applied to said sample-and-hold means as periodic sampling pulses therefor.

9. The converter of claim 1, further comprising amplifier means for amplifying said supplied analog signal and said periodically supplied reference signal and applying same to said coarse converting means; additional comparator means for receiving an additional reference level and for comparing the amplified periodic reference signal to said additional reference level to produce another D.C. compensating signal in accordance with said comparison; and means for applying said other D.C. compensating signal to said amplifier means for adjusting the D.C. level of said amplifier means.

10. The converter of claim 9 wherein said means for storing includes first sampling means for sampling the difference between said coarse analog reference signal and said periodically supplied reference signal at the same rate at which said reference signal is supplied; said additional comparator means includes second sampling means operative in synchronism with said first sampling means to sample said amplified periodic reference signal; and further comprising timing means for supplying periodic sampling pulses to said first and second sampling means.

11. The converter of claim 10 wherein said means for periodically supplying a reference signal to said coarse converting means comprises switch means having one input connected to receive said analog signal, another input connected to receive said reference signal and an output coupled to said amplifier means, said switch means being responsive to said periodic sampling pulses to switch said output from said one to said another input.

12. The converter of claim 11 wherein said video signal includes periodic synchronizing signals, and further comprising clock generator responsive to said video signal for generating clock pulses, and video signal sampling means for sampling the amplified video signal and supplying samples of said video signal to said coarse converting means.

13. The converter of claim 12 wherein said timing means is responsive to said periodic synchronizing signals such that said sampling pulses coincide with said periodic synchronizing signals, and said means for periodically supplying a reference signal is responsive to said sampling pulses for periodically replacing a portion of said video signal with said reference signal.

14. The converter of claim 13 wherein said periodic synchronizing signals are constituted by horizontal synchronizing signals; and wherein said portion of said video signal which is replaced by said reference signal consists of at least a part of the horizontal blanking interval of said video signal.

* * * * *